US011233524B1

(12) United States Patent
Bult

(10) Patent No.: US 11,233,524 B1
(45) Date of Patent: Jan. 25, 2022

(54) CAPACITIVE DIGITAL TO ANALOG CONVERTOR (CDAC) WITH CAPACITIVE REFERENCES

(71) Applicant: Ethernovia Inc., San Jose, CA (US)

(72) Inventor: Klaas Bult, Bosch en Duin (NL)

(73) Assignee: Ethernovia Inc., San Jose, CA (US)

( * ) Notice: Subject to any disclaimer, the term of this patent is extended or adjusted under 35 U.S.C. 154(b) by 0 days.

(21) Appl. No.: 17/150,510

(22) Filed: Jan. 15, 2021

Related U.S. Application Data

(60) Provisional application No. 62/961,566, filed on Jan. 15, 2020.

(51) Int. Cl.
*H03M 1/80* (2006.01)
*H03M 1/46* (2006.01)

(52) U.S. Cl.
CPC ........... *H03M 1/804* (2013.01); *H03M 1/462* (2013.01); *H03M 1/466* (2013.01)

(58) Field of Classification Search
CPC ....... H03M 1/804; H03M 1/462; H03M 1/466
USPC ......................................................... 341/172
See application file for complete search history.

(56) References Cited

U.S. PATENT DOCUMENTS

| 8,416,115 B2 * | 4/2013 | Araki | ..................... | H03M 1/466 |
| | | | | 341/172 |
| 8,537,045 B2 * | 9/2013 | Kapusta | .............. | H03M 1/0845 |
| | | | | 341/172 |

* cited by examiner

*Primary Examiner* — Khai M Nguyen
(74) *Attorney, Agent, or Firm* — Schwegman Lundberg & Woessner, P.A.

(57) ABSTRACT

Disclosed are circuits and methods for a CDAC with capacitive references. Individual reference capacitors can be implemented to provide the reference voltages for each input capacitor in a CDAC. For example, each input capacitor may be allocated a high-reference capacitor and a low-reference capacitor to provide the reference voltage to the respective input capacitor. Each of these reference capacitors is charged along with the input capacitor when the CDAC is configured into a loading configuration, and then used to convert digital data to an analog signal when the CDAC is configured into a conversion configuration. Accordingly, the reference voltage for each input capacitor is provided by a separate power source. This contrasts with current solutions in which the reference voltages for the input capacitors are provided by either a singular high-reference voltage source or low-reference voltage source.

20 Claims, 9 Drawing Sheets

CAPACITIVE DIGITAL TO ANALOG CONVERTOR (CDAC) WITH CAPACITIVE REFERENCES

CROSS-REFERENCE TO RELATED APPLICATIONS

The present application claims the benefit of priority of U.S. Provisional Application No. 62/961,566 filed on Jan. 15, 2020, which is incorporated herein by reference in its entirety.

TECHNICAL FIELD

An embodiment of the present subject matter relates generally to capacitive digital to analog convertors (CDACs), and more specifically, to a CDAC with capacitive references.

BACKGROUND

In electronics, a Digital to Analog Convertor (DAC) is an electronic device that converts a digital signal into an analog signal. For example, a DAC receives digital data (e.g., a binary value) as input and transforms the digital data into a corresponding analog signal. A Capacitive DAC (CDAD) is a type of DAC that uses multiple capacitors of different sizes to convert digital data received as input into an analog signal. The capacitors are arranged in a binary weighted capacitor array where each capacitor corresponds to a different bit of an input binary value. For example, the first capacitor corresponds to the most significant bit, the next capacitor corresponds to the next significant bit, and so on until the least significant bit. During each cycle, the capacitors are initially charged from current drawn from a power source. Once the capacitors are charged, each capacitor is then connected to either a high reference voltage or a low reference voltage based on the value of the bit in the input binary value corresponding to the capacitor. Connecting the capacitors to the high reference voltage or the low reference voltage in this manner results in current to be expelled by the capacitors which cumulatively provide an analog output voltage that corresponding to the input binary value.

CDACs are commonly used in electronic devices and components, such as Successive-Approximation Register (SAR) Analog to Digital Converters (ADCs). One issue with using CDACs is that significant current is needed to charge the capacitors from the reference inputs quickly. Performing these operations quickly is desirable, particularly when using CDACs in asynchronous-timed SAR ADCs. Drawing the significant current needed to accomplish this, however, can cause issues, such as unwanted levels of power dissipation. Accordingly, improvements are needed.

BRIEF DESCRIPTION OF THE DRAWINGS

Various ones of the appended drawings merely illustrate example embodiments of the present disclosure and cannot be considered as limiting its scope.

DETAILED DESCRIPTION

Figure 1:
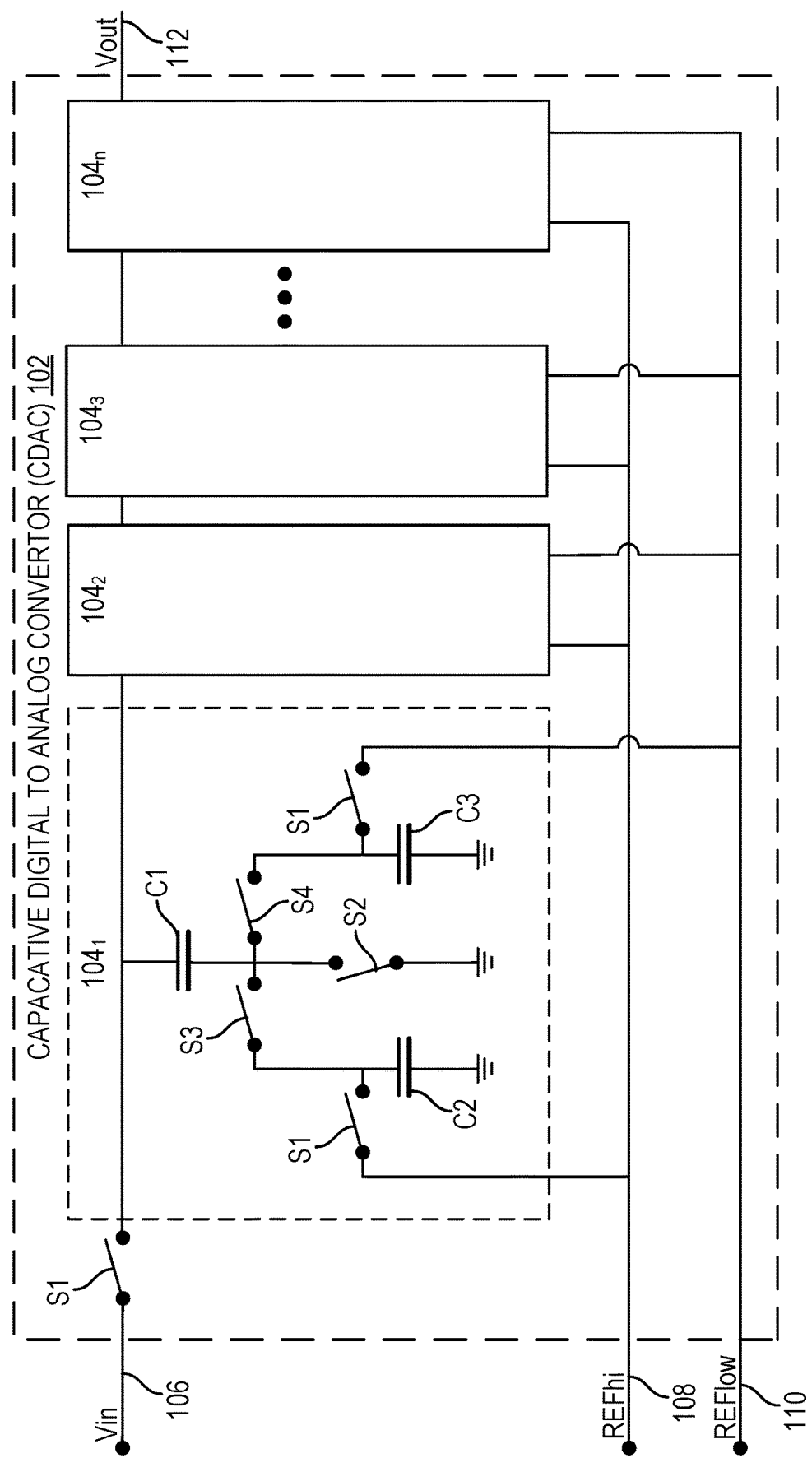
FIG. 1 is a diagram of a CDAC with capacitive references, according to certain example embodiments.

In the following description, for purposes of explanation, various details are set forth in order to provide a thorough understanding of some example embodiments. It will be apparent, however, to one skilled in the art, that the present subject matter may be practiced without these specific details, or with slight alterations.

Disclosed are circuits and methods for a CDAC with capacitive references. CDACs are commonly used in electronic devices and component, such as SAR ADCs. CDACS uses multiple capacitors ("input capacitors") of different sizes to convert digital data received as input into an analog signal. The input capacitors are arranged in a binary weighted capacitor array where each input capacitor corresponds to a different bit of an input binary value. For example, the first input capacitor corresponds to the most significant bit in the input binary value, the next capacitor corresponds to the next significant bit in the input binary value, and so on. During each cycle, the input capacitors are initially charged by an input voltage source to a specified voltage. Once the input capacitors are charged, each input capacitor is then connected to either a high reference voltage or a low reference voltage based on the value of the bit in the input binary value corresponding to the input capacitor. Connecting the input capacitors to the high reference voltage or the low reference voltage in this manner results in current to be expelled by the input capacitors, which cumulatively provide an analog output voltage that corresponding to the input binary value.

As explained earlier, one issue with using CDACs is that significant current is needed to convert digital data to an analog signal, which can cause unwanted levels of power dissipation. To alleviate this issue, individual reference capacitors can be implemented to provide the reference voltages for each input capacitor. For example, each input capacitor may be allocated a high-reference capacitor and a low-reference capacitor to provide the reference voltage to the respective input capacitor. Each of these reference capacitors is charged along with the input capacitor when the CDAC is configured in a loading configuration, and then used to convert digital data to an analog signal when the CDAC is configured into a conversion configuration. Accordingly, the reference voltage for each input capacitor is provided by a separate power source. This contrasts with current solutions in which the reference voltages for the input capacitors are provided by either a singular high-reference voltage source or low-reference voltage source.

A CDAC with capacitive references provides multiple improvements over current solutions. For example, use of capacitive references provides for much faster settling than when using reference buffers. Implementing individual reference capacitors for each input capacitor allows for the use of smaller capacitors than when using global capacitive references to provide the reference voltages. For example, the individual reference capacitors used to provide reference voltage to a single input capacitor may be approximately or even smaller in size to the respective input capacitor. In contrast, a single global capacitive reference used to provide reference voltage to each input capacitor in a CDAC would have to be very large in size, such as over 100 times the combined size of the input capacitors. A CDAC using capacitive references for each input capacitor therefore provides for the use of smaller capacitors, faster settling speeds, and low power dissipation.

FIG. 1 is a diagram of a CDAC 102 with capacitive references, according to certain example embodiments. To avoid obscuring the inventive subject matter with unnecessary detail, various functional components (e.g., modules, mechanisms, devices, nodes, etc.) that are not germane to conveying an understanding of the inventive subject matter have been omitted from FIG. 1. However, a skilled artisan will readily recognize that various additional functional components may be supported to facilitate additional functionality that is not specifically described herein.

The CDAC 102 may be implemented in any of a variety of electronic devices. For example, the CDAC 102 may be implemented in a device including some or all of the features, components, and peripherals of the machine 600 shown in FIG. 6.

As shown, the CDAC 102 includes multiple bit-converting components $104_1$, $104_2$, $104_3$, . . . $104_n$ (collectively "104"), arranged in an array. Each bit-converting component $104_1$, $104_2$, $104_3$, . . . $104_n$ corresponds to a single bit of an input binary value that is to be converted to an analog signal by the CDAC 102. For example, the first bit-converting component $104_1$ in the array corresponds to the most significant bit in the input binary value, the second bit-converting component $104_2$ in the array corresponds to the next most significant bit in the input binary value (e.g., most significant bit—1), and so on until the last bit-converting component $104_n$ in the array, which corresponds to the least significant bit in the input binary value. Accordingly, the number of bit-converting components 104 included in the CDAC 102 may vary in implementation based on the desired size of input binary values to be converted by the CDAC 102. For example, four bit-converting components 104 may be included in a CDAC 102 to convert four-digit binary values (e.g., 0000-1111) to analog. As another example, eight bit-converting components 104 may be included in a CDAC 102 to convert eight-digit binary values (e.g., 00000000-1111111) to analog.

Each of the bit-converting components 104 is connected to an input voltage source 106, a high-reference voltage source 108, and a low-reference voltage source 110. As shown, each of the bit-converting components 104 includes an input capacitor C1, a high-reference capacitor C2, and a low-reference capacitor C3. The input capacitor C1 included in each bit-converting unit 104 may be sized to create a binary weighted capacitor array in which the size of each sequential input capacitor C1 in the binary weighted capacitor array is proportionally sized in relation to the previous and/or next input capacitor C1 in the array. For example, the size of each input capacitor C1 in the array may be half that of the previous input capacitor C1 in array, such that the input capacitor C1 included in the first bit-converting component $104_1$ may be twice the size of the input capacitor C1 included in the second bit-converting component $104_2$, which is twice the size of the input capacitor C3 included in third bit-converting component $104_3$, and so on. Accordingly, CDAC 102 including six input capacitors C1 may include input capacitors C1 with sizes of 32C, 16C, 8C, 4C, 2C, and 1C.

The high-reference capacitor C2 and low-reference capacitor C3 included in each bit-converting component 104 can be approximately the same size as the input capacitor C1 included in the bit-converting components 104, however larger sizes of capacitors may be used if desired.

To convert binary values to analog signals, the configuration of the CDAC 102 is shifted between a loading configuration and a conversion configuration. When the CDAC 102 is configured into the loading configuration, the input capacitors C1, high-reference capacitors C2 and low-reference capacitors C3 are connected to the input voltage source 106, high-reference voltage source 108, and low-reference voltage source 110 respectively, and charged to specified voltages. For example, the input capacitors C1 are charged to a specified input voltage provided by the input voltage source 106, the high-reference capacitors C2 are charged to a specified high-reference voltage provided by the high-reference voltage source 108, and the low-reference capacitors C3 are charged to a specified low-reference voltage provided by the low-reference voltage source 110.

When the CDAC 102 is configured into the conversion configuration, the connections between the input capacitors C1, high-reference capacitors C2 and low-reference capacitors C3 and their respective voltage sources are interrupted, and each input capacitor C1 is connected to either the high-reference capacitor C2 or low-reference capacitor C3 based on the value of the bit in the input binary value corresponding to the bit-converting component 104. For example, the input capacitor C1 is connected to the high-reference capacitor C2 when the value of the bit is 1, whereas the input capacitor C1 is connected to the low-reference capacitor C3 when the value of the bit is 0. Connecting the input capacitors C1 to either the high-reference capacitor C2 or low-reference capacitor C3 in this manner causes the CDAC 102 provide an output voltage 112 corresponding to the input binary value.

Various electronic switches are used to modify the configuration of the CDAC 102 between the loading configuration and the conversion configuration. The electronic switches may be any type of electronic switch that is capable of coupling and decoupling electronic components within a circuit. An electronic switch may be an electronic component configured into various operational states to disconnect or connect a conducting path in an electronic circuit to interrupt or divert electrical current from one conductor to another. For example, an electronic switch may be configured in an open state to interrupt electrical current along a conducting path. Alternately, an electronic switch may be configured in a closed state to allow electrical current to pass from one conductor to another along a conducting path.

The CDAC includes charging switches S1 that are coupled between the input capacitors C1, high-reference capacitors C2, and low-reference capacitor C3, and their respective power sources. For example, the charging switches S1 includes an electronic switch coupled between the input voltage source 106 and the input capacitors C1, as well as electronic switches coupled between each high-reference capacitor C2 and the high-reference voltage source 108, and each low-reference capacitor C3 and the low-reference voltage source 110. Each bit-converting component 104 also includes a ground switch S2 coupled between the input capacitor C1 and ground, a high-reference switch S3 coupled between the input capacitor C1 and the high-reference capacitor C2, and a low-reference switch S4 coupled between the input capacitor C1 and the low-reference capacitor C3.

To configure the CDAC 102 into the loading configuration, the charging switches S1 and the ground switches S2 are configured into a closed state, and the high-reference and low-reference switches S3, S4 are configured into an open state. This allows the input capacitors C1 to be charged by the input voltage source 106, the high-reference capacitors C2 to be charged by the high-reference voltage source 108, and the low-reference capacitors C3 to be charged by the low-reference voltage source 110, while also preventing current to flow from the high-reference capacitors C2 or low-reference capacitors C3 to the input capacitors C1.

To configure the CDAC 102 into the conversion configuration, the charging switches S1 and the ground switches S2 are configured in the open state. Further, in each bit-converting component 104, one of either the high-reference switch S3 coupled between the input capacitor C1 and the high-reference capacitor C2 or the low-reference switch S4 coupled between the input capacitor C1 and the low-reference capacitor C3 is configured into the open state, while the other is configured into the closed state. For example, if the bit in the binary input corresponding to the bit-converting component 104 has a value of 1, the high-reference switch S3 coupled between the input capacitor C1 and the high-reference capacitor C2 is configured into the closed state, while the low-reference switch S4 coupled between the input capacitor C1 and the low-reference capacitor C3 is configured into the open state. In contrast, if the bit in the binary input corresponding to the bit-converting component 104 has a value of 0, the high-reference switch S3 is configured into the open state and the low-reference switch S4 coupled into the closed state.

Configuring the CDAC 102 into the conversion configuration prevents current from flowing from the input voltage source 106, the high-reference voltage source 108, and the low-reference voltage source 110 to the input capacitors C1, high-reference capacitors C2, and the to the low-reference capacitors C3, and causes the causes the CDAC 102 provide an output voltage 112 corresponding to the input binary value. For example, each of the bit-converting component 104 provides an output based on the reference voltage and input voltage stored by its respective input capacitor C1 and either the high-reference capacitor C2 or low-reference capacitor C3 that is connected to the input capacitor C1. The cumulative outputs provided by the bit-converting components 104 result in an output voltage 112 corresponding to the input binary value that is converted by the CDAC 102.

Figure 2A:
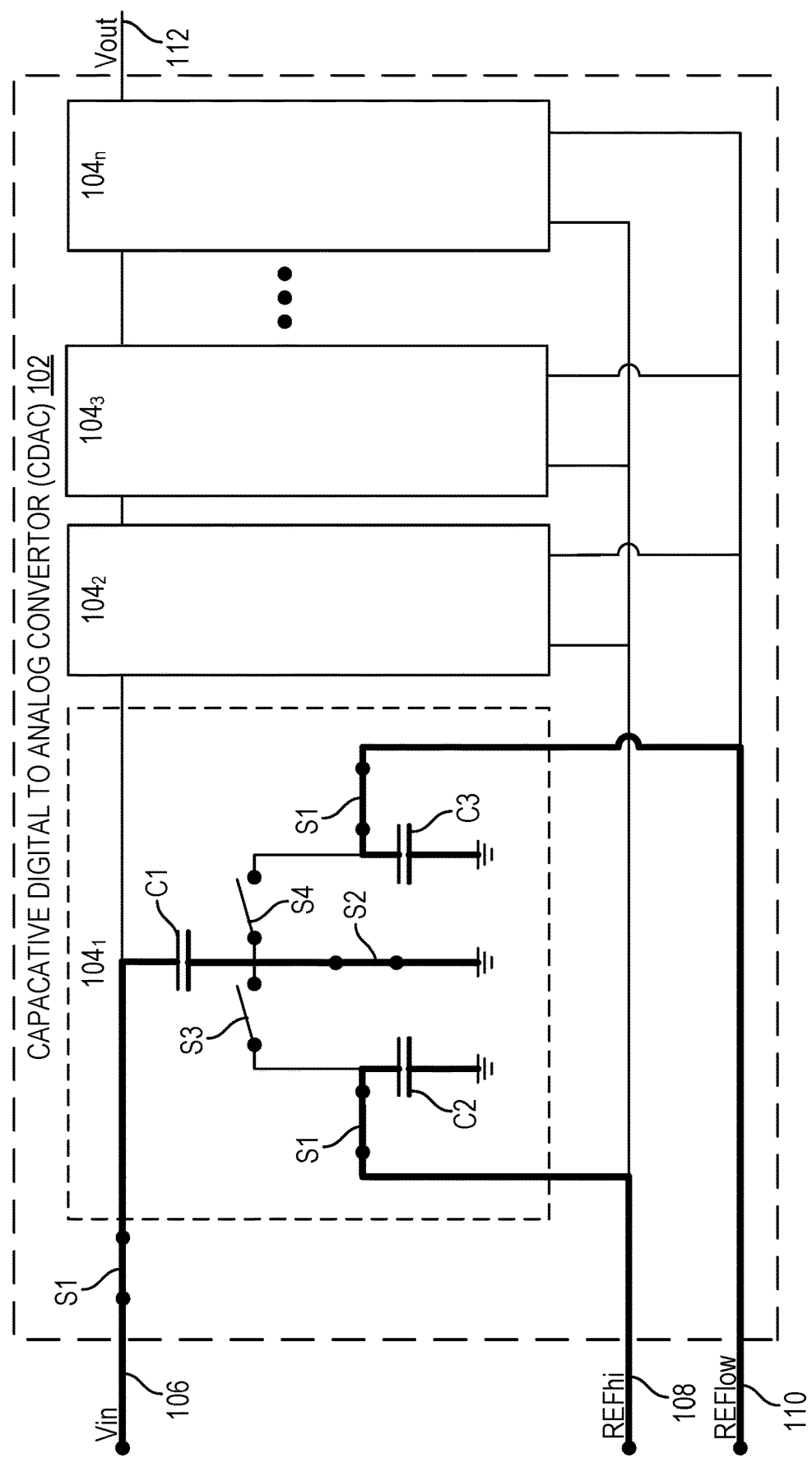
FIGS. 2A-2D show a CDAC with capacitive references configured in various operating configurations, according to certain example embodiments.

FIGS. 2A-2D show a CDAC 102 with capacitive references configured in various operating configurations, according to certain example embodiments. FIG. 2A shows the CDAC 102 configured in a loading configuration. As shown, the charging switches S1 and the ground switches S2 are configured in a closed state, while the high-reference and low-reference switches S3, S4 are configured in an open state. In the loading configuration, each of the input capacitors C1 receives an input voltage from the input voltage source 106. Similarly, the high-reference capacitors C2 receive a high-reference voltage from the high-reference voltage source 108, and the low-reference capacitors C3 receive a low-reference voltage from the low-reference voltage source 110.

Figure 2B:
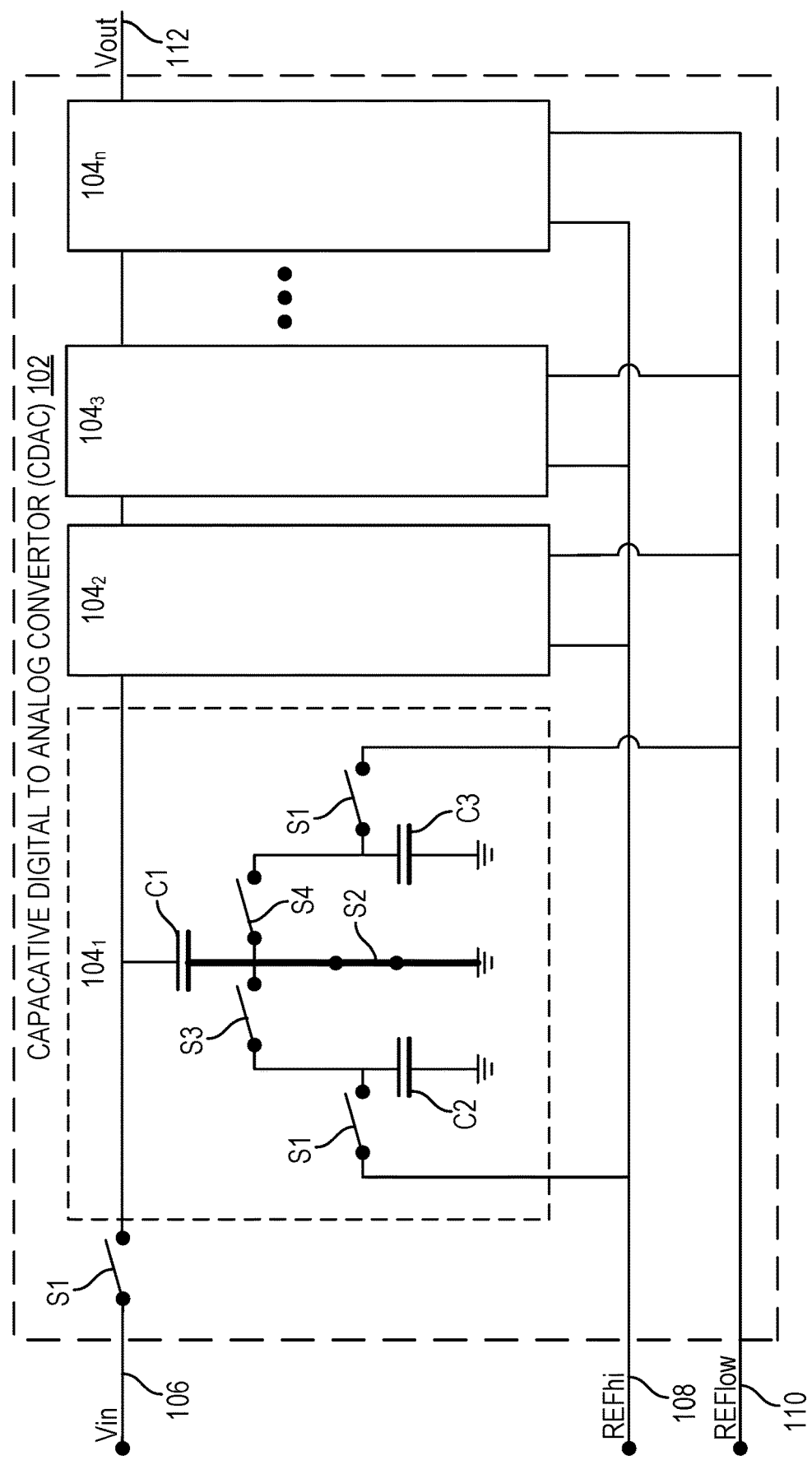

FIG. 2B shows the CDAC 102 configured in a hold portion of the conversion configuration. As shown in FIG. 2B, the charring switches S1 are now configured into the open state, while the ground switches S2 remain configured in the closed state, and the high-reference and low-reference switches S3, S4 remain configured in the open state. As a result, the input capacitors C1 no longer receive input voltage from the input voltage source 106, the high-reference capacitors C2 no longer receive a high-reference voltage from the high-reference voltage source 108, and the low-reference capacitors C3 no longer receive a low-reference voltage from the low-reference voltage source 110. The input capacitors C1, however, remain connected to ground.

Figure 2C:
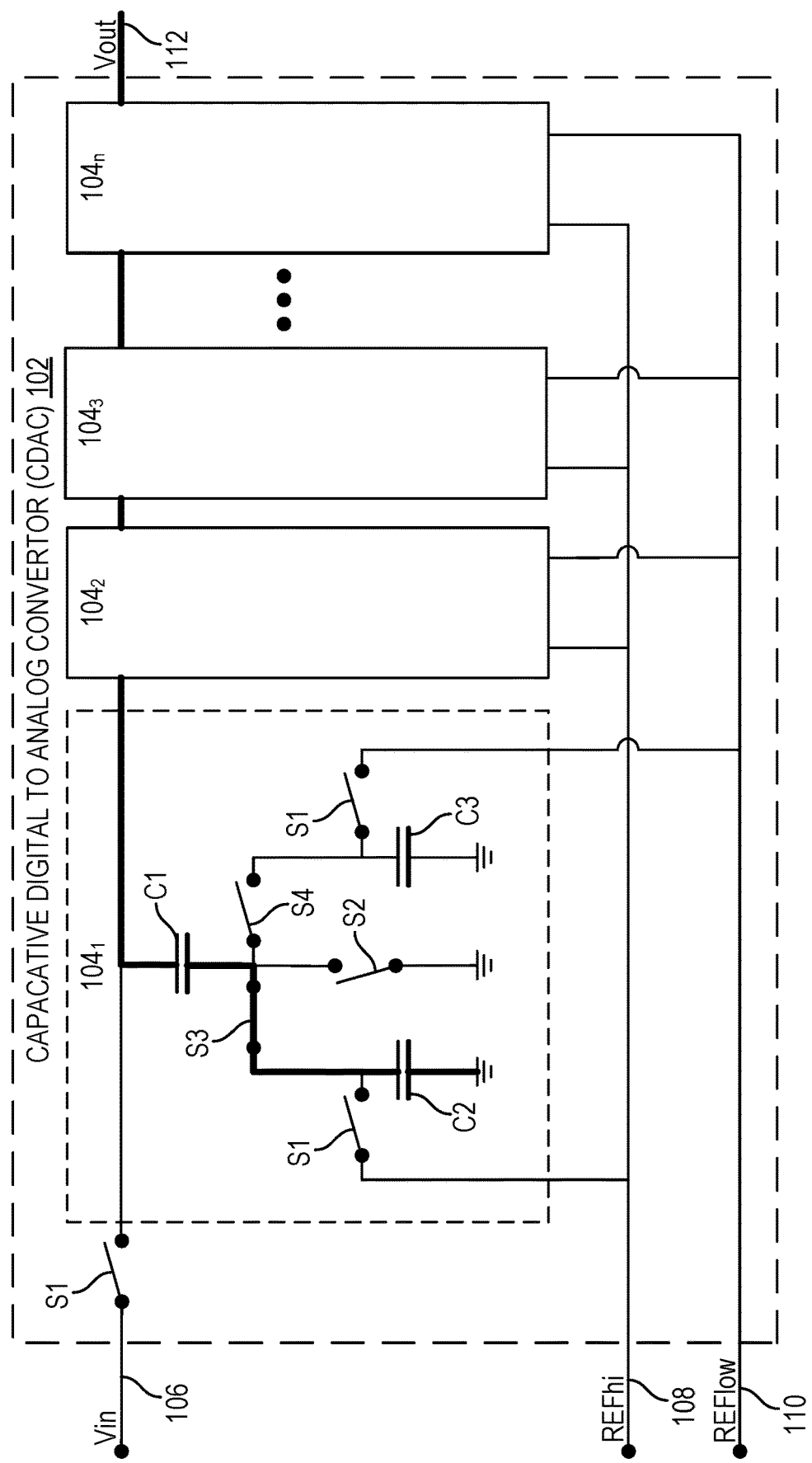

FIG. 2C shows the CDAC 102 configured the conversion configuration. As shown, the charging switches S1 remain in the open state, however the ground switches S2 are now configured to in the open state to disconnect the input capacitors from ground. When the CDAC 102 is configured into the conversion configuration the input capacitor C1 implemented within each bit-converting component 104 is connected to one of the high-reference capacitor C2 or the low reference capacitor C3. For example, as shown in FIG. 2C, the high-reference switch S3 is in the closed state to connect the high-reference capacitor C2 to the input capacitor C1, while the low-reference switch S4 coupled between the low-reference capacitor C3 and the input capacitor C1 remains in the open state. Accordingly, the high-reference capacitor C2 provides its stored reference voltage to the input capacitor C1 to generate the output voltage 112.

Figure 2D:
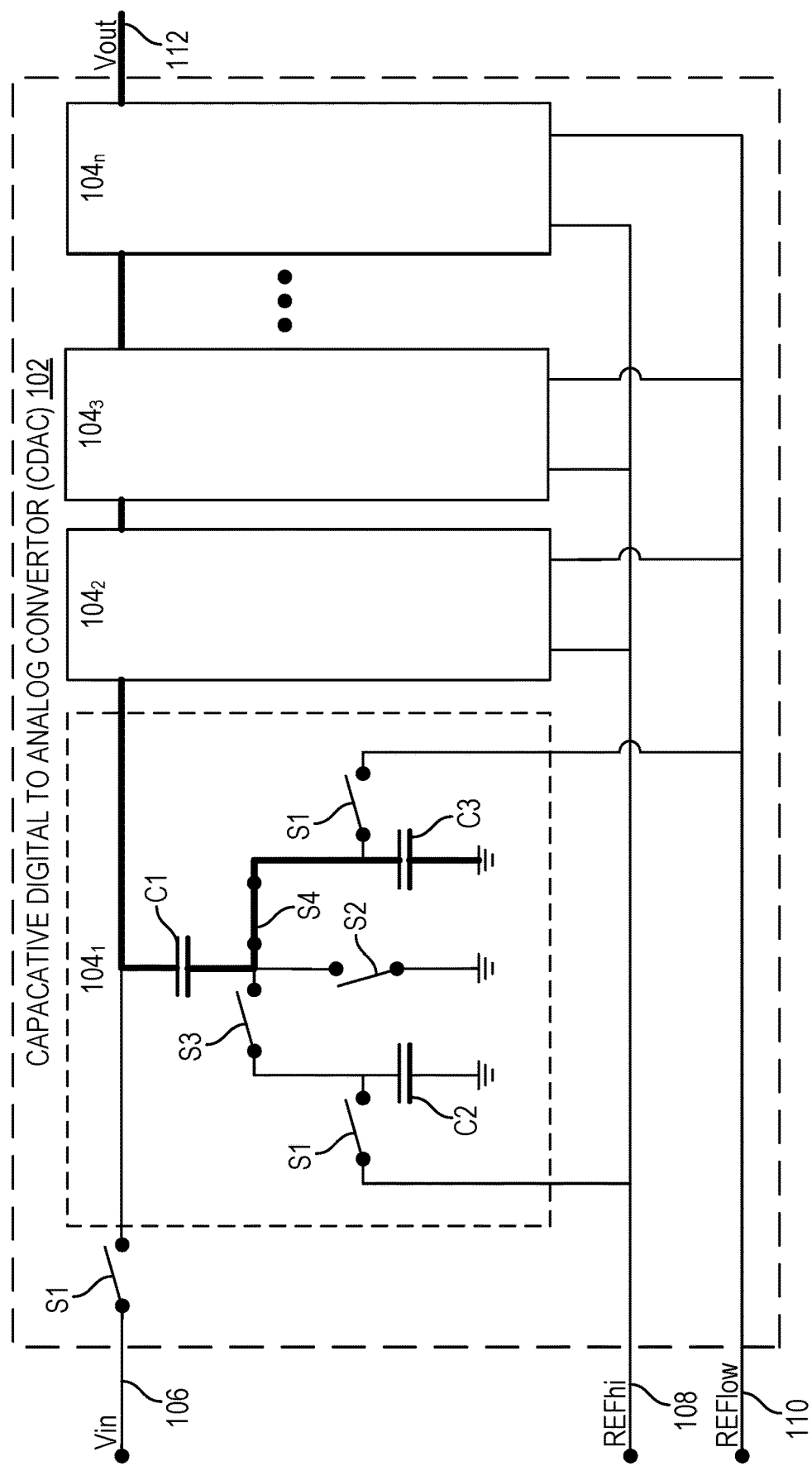

In contrast, FIG. 2D shows the input capacitor C1 connected to the low-reference capacitor C3 rather than the high-reference capacitor C2. For example, the low-reference switch S4 coupled between the low-reference capacitor C3 and the input capacitor C1 is in the closed state, while the high-reference switch S3 is in the open state. Accordingly, in FIG. 2D, the low-reference capacitor C2, rather than the high-reference capacitor C3, provides its stored reference voltage to the input capacitor C1 to generate the output voltage 112.

When the CDAC 102 is configured in the conversion configuration, the input capacitors C1 included in each bit-converting component 104 may be connected to either the high-reference capacitor C2, as shown in FIG. 2C, or the low-reference capacitor C3, as shown in FIG. 2D, based on the input binary value that is being converted by the CDAC 102. For example, each bit-converting component 104 is connected to either the high-reference capacitor C2 or the low-reference capacitor C3 based on the value of the bit in the input binary value corresponding to the bit-converting component 104. Accordingly, when the CDAC 102 is configured into the conversion configuration, one of the bit-converting components 104 may include an input capacitor C1 coupled to the high-reference capacitor C2, and another input capacitor C1 coupled to the low-reference capacitor C3.

Figure 3:
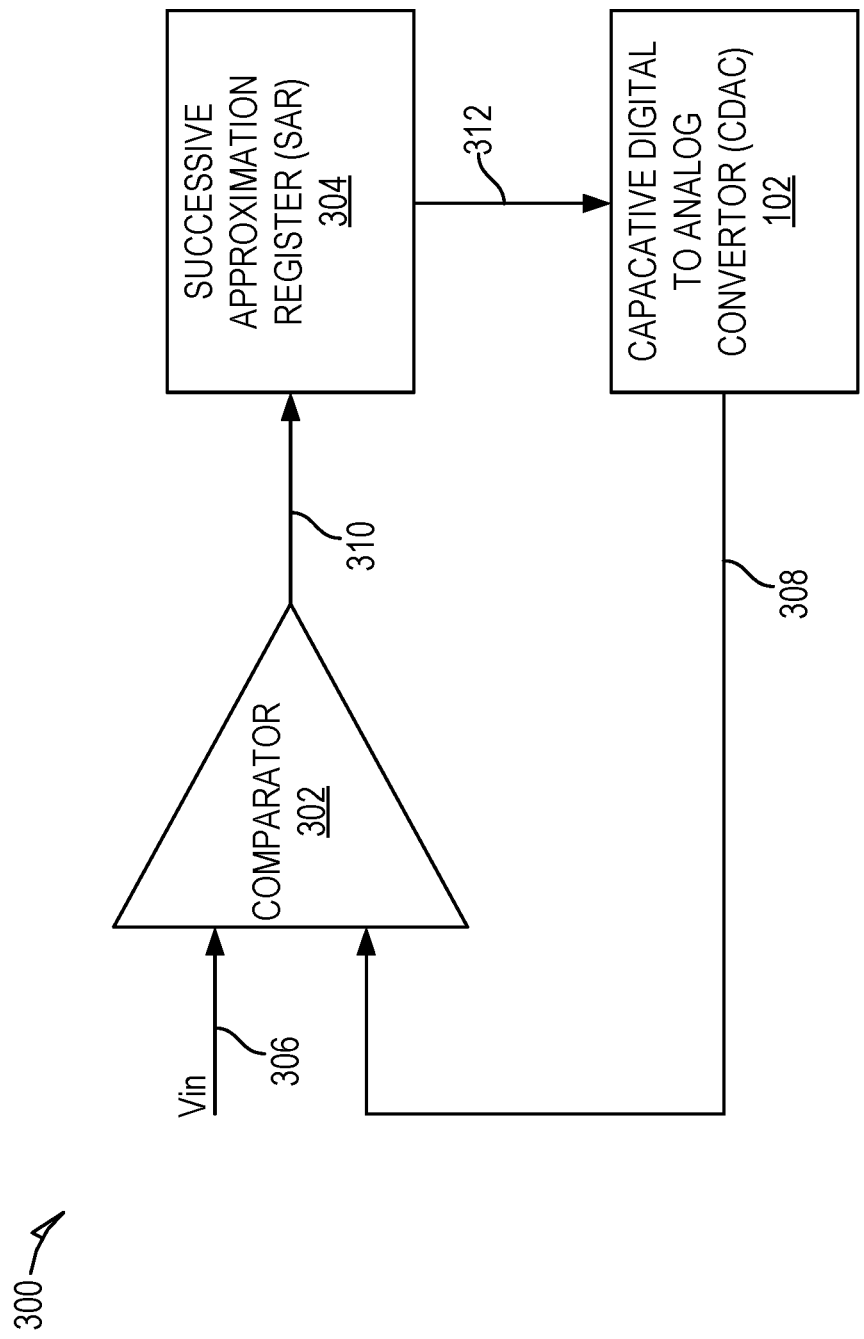
FIG. 3 is a diagram of a SAR ADC using a CDAC with capacitive references, according to certain example embodiments.

FIG. 3 is a diagram of a SAR ADC 300 using a CDAC 102 with capacitive references, according to certain example embodiments. To avoid obscuring the inventive subject matter with unnecessary detail, various functional components (e.g., modules, mechanisms, devices, nodes, etc.) that are not germane to conveying an understanding of the inventive subject matter have been omitted from FIG. 3. However, a skilled artisan will readily recognize that various additional functional components may be supported to facilitate additional functionality that is not specifically described herein.

As shown, the SAR ADC 300 includes a comparator 302, a successive approximation register (SAR) and a CDAC. The comparator 302 compares two input voltages and outputs a digital signal indicating which input voltage is larger. As shown, the comparator 302 receives an input voltage 306 to be converted to a digital binary value, and an output voltage 308 generated by the CDAC 102. The comparator 302 compares the two voltages 306, 308 and provides an output signal 310 to the SAR 304 that indicates which of the two voltages 306, 308 is larger. In turn, the SAR 304 provides a new input binary value 312 to the CDAC 102 to be converted to an analog output voltage 308. This process results in conversion of the input voltage 306 to a binary value.

Figure 4:
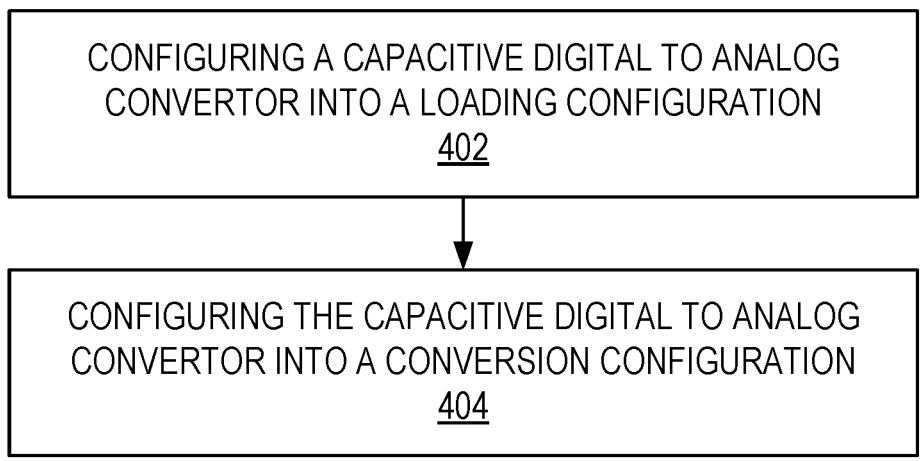
FIG. 4 is a flowchart showing a method for using a CDAC with capacitive references, according to some example embodiments.

FIG. 4 is a flowchart showing a method 400 for using a CDAC 102 with capacitive references, according to some example embodiments. The method 400 is described below by way of example with reference to the CDAC 102 shown in FIG. 1, however, it shall be appreciated that at least some of the operations of the method 400 may be deployed on various other hardware and/or software configurations and the method 400 is not intended to be limited to the CDAC 102 shown in FIG. 1.

At operation 402, a CDAC 102 is configured into a loading configuration. When the CDAC 102 is configured into the loading configuration, input capacitors C1, high-reference capacitors C2 and low-reference capacitors C3 included in the CDAC 102 are connected to an input voltage source 106, high-reference voltage source 108, and low-reference voltage source 110 respectively, and charged to specified voltages. For example, the input capacitors C1 are charged to a specified input voltage provided by the input voltage source 106, the high-reference capacitors C2 are charged to a specified high-reference voltage provided by the high-reference voltage source 108, and the low-reference capacitors C3 are charged to a specified low-reference voltage provided by the low-reference voltage source 110.

To configure the CDAC 102 into the loading configuration, charging switches S1 coupled between the input capacitors C1, high-reference capacitors C2, and low-reference capacitor C3, and their respective power sources are configured into a closed state. Similarly, ground switches S2 coupled between the input capacitors C1 and ground are also configured into a closed state. In contrast, high-reference switches S3 coupled between the input capacitors C1 and the high-reference capacitors C2, and low-reference switches S4 coupled between the input capacitors C1 and the low-reference capacitors C3 are configured into an open state. This allows the input capacitors C1 to be charged by the input voltage source 106, the high-reference capacitors C2 to be charged by the high-reference voltage source 108, and the low-reference capacitors C3 to be charged by the low-reference voltage source 110, while also preventing current to flow from the high-reference capacitors C2 or low-reference capacitors C3 to the input capacitors C1.

At operation 404, the CDAC 102 is configured into a conversion configuration. When the CDAC 102 is configured into the conversion configuration, the connections between the input capacitors C1, high-reference capacitors C2 and low-reference capacitors C3 and their respective voltage sources are interrupted, and each input capacitor C1 is connected to either the high-reference capacitor C2 or low-reference capacitor C3 based on the value of the bit in the input binary value corresponding to the bit-converting component 104. For example, the input capacitor C1 is connected to the high-reference capacitor C2 when the value of the bit is 1, whereas the input capacitor C1 is connected to the low-reference capacitor C3 when the value of the bit is 0. Connecting the input capacitors C1 to either the high-reference capacitor C2 or low-reference capacitor C3 in this manner causes the CDAC 102 provide an output voltage 112 corresponding to the input binary value.

To configure the CDAC 102 into the conversion configuration, the charging switches S1 and the ground switches S2 are configured in the open state. Further, in each bit-converting component 104, one of either the high-reference switch S3 or the low-reference switch S4 is configured into the open state, while the other is configured into the closed state. For example, if the bit in the binary input corresponding to the bit-converting component 104 has a value of 1, the high-reference switch S3 is configured into the closed state to connect the input capacitor C1 to the high-reference capacitor C2, while the low-reference switch S4 coupled between the input capacitor C1 and the low-reference capacitor C3 is configured into the open state. In contrast, if the bit in the binary input corresponding to the bit-converting component 104 has a value of 0, the high-reference switch S3 is configured into the open state and the low-reference switch S4 is configured into the closed state to connect the input capacitor C1 to the low-reference capacitor C3.

Configuring the CDAC 102 into the conversion configuration prevents current from flowing from the input voltage source 106, the high-reference voltage source 108, and the low-reference voltage source 110 to the input capacitors C1, high-reference capacitors C2, and the to the low-reference capacitors C3, and causes the CDAC 102 to provide an output voltage 112 corresponding to the input binary value. For example, each of the bit-converting components 104 provides an output based on the reference voltage and input voltage stored by its respective input capacitor C1 and either the high-reference capacitor C2 or low-reference capacitor C3 that is connected to the input capacitor C1. The cumulative outputs provided by the bit-converting components 104 result in an output voltage 112 corresponding to the input binary value that is converted by the CDAC 102.

Software Architecture

Figure 5:
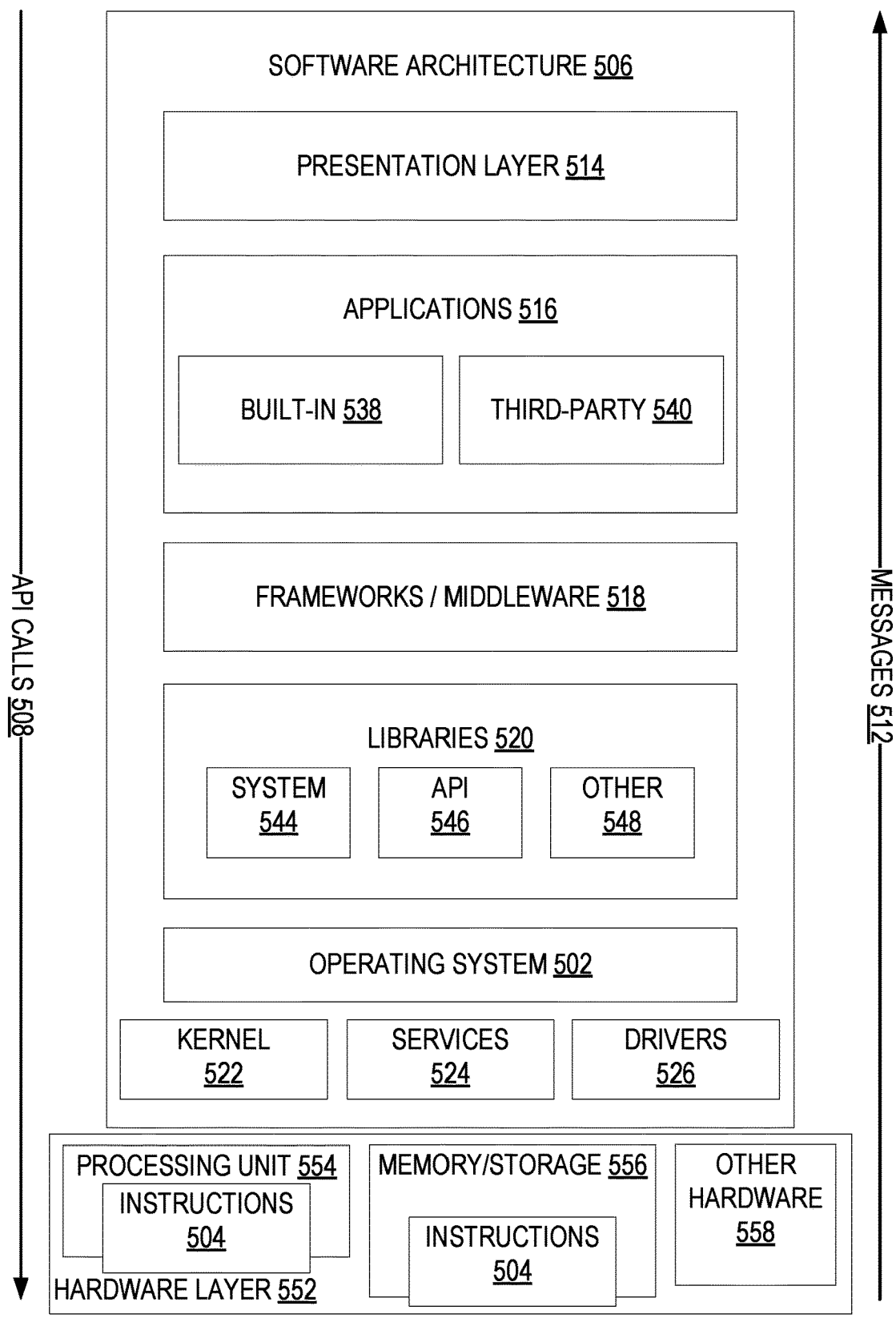
FIG. 5 is a block diagram illustrating an example software architecture, which may be used in conjunction with various hardware architectures herein described.

FIG. 5 is a block diagram illustrating an example software architecture 506, which may be used in conjunction with various hardware architectures herein described. FIG. 5 is a non-limiting example of a software architecture 506 and it will be appreciated that many other architectures may be implemented to facilitate the functionality described herein. The software architecture 506 may execute on hardware such as machine 600 of FIG. 6 that includes, among other things, processors 604, memory 614, and (input/output) I/O components 618. A representative hardware layer 552 is illustrated and can represent, for example, the machine 600 of FIG. 6. The representative hardware layer 552 includes a processing unit 554 having associated executable instructions 504. Executable instructions 504 represent the executable instructions of the software architecture 506, including implementation of the methods, components, and so forth described herein. The hardware layer 552 also includes memory and/or storage modules 556, which also have executable instructions 504. The hardware layer 552 may also comprise other hardware 558.

In the example architecture of FIG. 5, the software architecture 506 may be conceptualized as a stack of layers where each layer provides particular functionality, such as the Open Systems Interconnection model (OSI model). For example, the software architecture 506 may include layers such as an operating system 502, libraries 520, frameworks/middleware 518, applications 516, and a presentation layer 514. Operationally, the applications 516 and/or other components within the layers may invoke application programming interface (API) calls 508 through the software stack and receive a response such as messages 512 in response to the API calls 508. The layers illustrated are representative in nature and not all software architectures have all layers. For example, some mobile or special purpose operating systems may not provide a frameworks/middleware 518, while others may provide such a layer. Other software architectures may include additional or different layers.

The operating system 502 may manage hardware resources and provide common services. The operating system 502 may include, for example, a kernel 522, services 524, and drivers 526. The kernel 522 may act as an abstraction layer between the hardware and the other software layers. For example, the kernel 522 may be responsible for memory management, processor management (e.g., scheduling), component management, networking, security settings, and so on. The services 524 may provide other common services for the other software layers. The drivers 526 are responsible for controlling or interfacing with the underlying hardware. For instance, the drivers 526 include display drivers, camera drivers, Bluetooth® drivers, flash memory drivers, serial communication drivers (e.g., Universal Serial Bus (USB) drivers), Wi-Fi® drivers, audio drivers, power management drivers, and so forth, depending on the hardware configuration.

The libraries 520 provide a common infrastructure that is used by the applications 516 and/or other components and/or layers. The libraries 520 provide functionality that allows other software components to perform tasks in an easier fashion than to interface directly with the underlying operating system 502 functionality (e.g., kernel 522, services 524, and/or drivers 526). The libraries 520 may include system libraries 544 (e.g., C standard library) that may provide functions such as memory allocation functions, string manipulation functions, mathematical functions, and the like. In addition, the libraries 520 may include API libraries 546 such as media libraries (e.g., libraries to support presentation and manipulation of various media format such as MPEG4, H.264, MP3, AAC, AMR, JPG, PNG), graphics libraries (e.g., an OpenGL framework that may be used to render 2D and 3D in a graphic content on a display), database libraries (e.g., SQLite that may provide various relational database functions), web libraries (e.g., WebKit that may provide web browsing functionality), and the like. The libraries 520 may also include a wide variety of other libraries 548 to provide many other APIs to the applications 516 and other software components/modules.

The frameworks/middleware 518 (also sometimes referred to as middleware) provide a higher-level common infrastructure that may be used by the applications 516 and/or other software components/modules. For example, the frameworks/middleware 518 may provide various graphical user interface (GUI) functions, high-level resource management, high-level location services, and so forth. The frameworks/middleware 518 may provide a broad spectrum of other APIs that may be used by the applications 516 and/or other software components/modules, some of which may be specific to a particular operating system 502 or platform.

The applications 516 include built-in applications 538 and/or third-party applications 540. Examples of representative built-in applications 538 may include, but are not limited to, a contacts application, a browser application, a book reader application, a location application, a media application, a messaging application, and/or a game application. Third-party applications 540 may include an application developed using the ANDROID™ or IOS™ software development kit (SDK) by an entity other than the vendor of the particular platform, and may be mobile software running on a mobile operating system such as IOS™, ANDROID™, WINDOWS® Phone, or other mobile operating systems. The third-party applications 540 may invoke the API calls 508 provided by the mobile operating system (such as operating system 502) to facilitate functionality described herein.

The applications 516 may use built in operating system functions (e.g., kernel 522, services 524, and/or drivers 526), libraries 520, and frameworks/middleware 518 to create UIs to interact with users of the system. Alternatively, or additionally, in some systems, interactions with a user may occur through a presentation layer, such as presentation layer 514. In these systems, the application/component "logic" can be separated from the aspects of the application/component that interact with a user.

Figure 6:
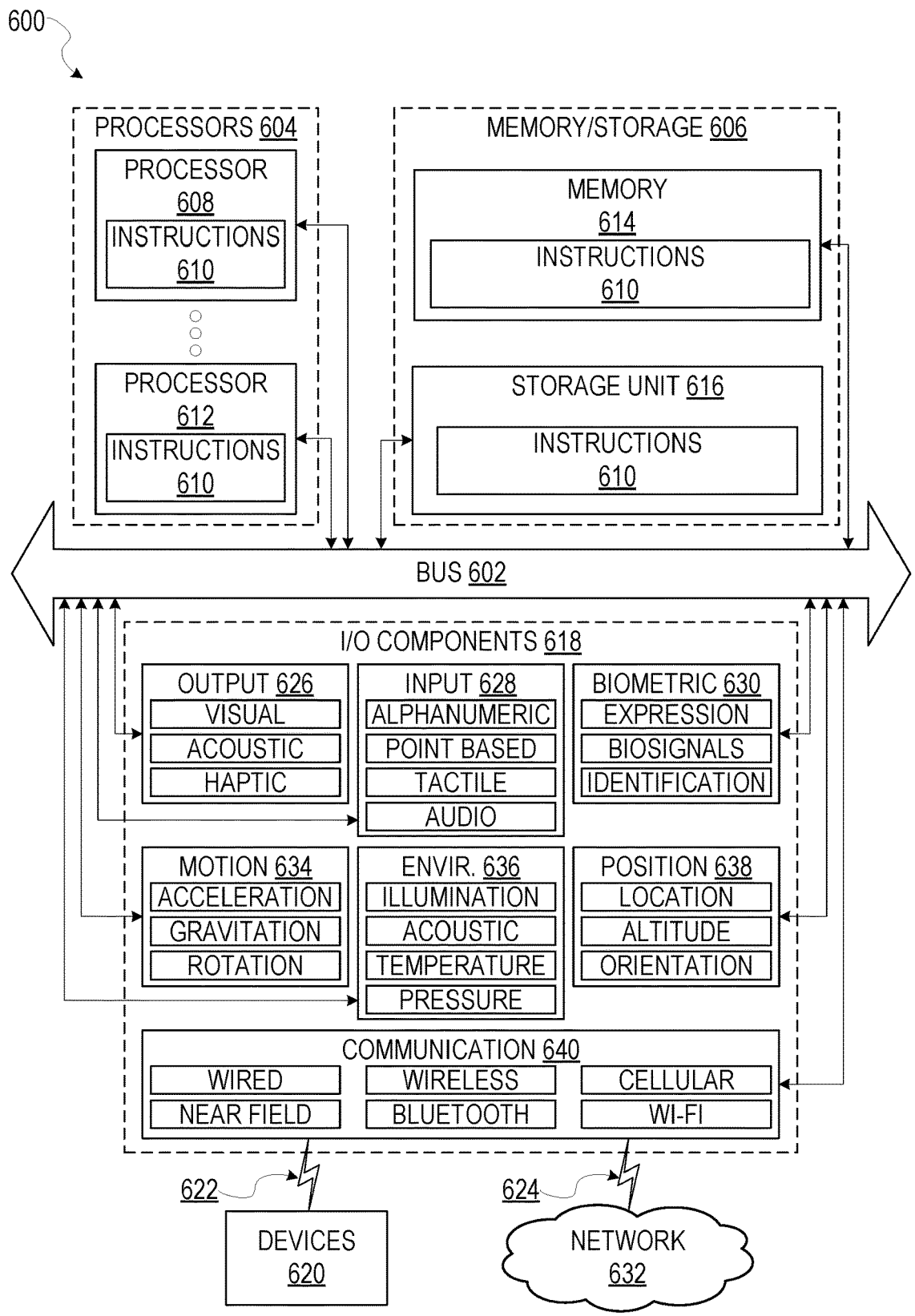
FIG. 6 is a block diagram illustrating components of a machine, according to some example embodiments, able to read instructions from a machine-readable medium (e.g., a machine-readable storage medium) and perform any one or more of the methodologies discussed herein.

FIG. 6 is a block diagram illustrating components of a machine 600, according to some example embodiments, able to read instructions 504 from a machine-readable medium (e.g., a machine-readable storage medium) and perform any one or more of the methodologies discussed herein. Specifically, FIG. 6 shows a diagrammatic representation of the machine 600 in the example from of a computer system, within which instructions 610 (e.g., software, a program, an application, an applet, an app, or other executable code) for causing the machine 600 to perform any one or more of the methodologies discussed herein may be executed. As such, the instructions 610 may be used to implement modules or components described herein. The instructions 610 transform the general, non-programmed machine 600 into a particular machine 600 programmed to carry out the described and illustrated functions in the manner described. In alternative embodiments, the machine 600 operates as a standalone device or may be coupled (e.g., networked) to other machines. In a networked deployment, the machine 600 may operate in the capacity of a server machine or a client machine in a server-client network environment, or as a peer machine in a peer-to-peer (or distributed) network environment. The machine 600 may comprise, but not be limited to, a server computer, a client computer, a PC, a tablet computer, a laptop computer, a netbook, a set-top box (STB), a personal digital assistant (PDA), an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine 600 capable of executing the instructions 610, sequentially or otherwise, that specify actions to be taken by machine 600. Further, while only a single machine 600 is illustrated, the term "machine" shall also be taken to include a collection of machines that individually or jointly execute the instructions 610 to perform any one or more of the methodologies discussed herein.

The machine 600 may include processors 604, memory/storage 606, and I/O components 618, which may be configured to communicate with each other such as via a bus 602. The memory/storage 606 may include a memory 614, such as a main memory, or other memory storage, and a storage unit 616, both accessible to the processors 604 such as via the bus 602. The storage unit 616 and memory 614 store the instructions 610 embodying any one or more of the methodologies or functions described herein. The instructions 610 may also reside, completely or partially, within the memory 614, within the storage unit 616, within at least one of the processors 604 (e.g., within the processor's cache memory), or any suitable combination thereof, during execution thereof by the machine 600. Accordingly, the memory 614, the storage unit 616, and the memory of processors 604 are examples of machine-readable media.

The I/O components 618 may include a wide variety of components to receive input, provide output, produce output, transmit information, exchange information, capture measurements, and so on. The specific I/O components 618 that are included in a particular machine 600 will depend on the type of machine. For example, portable machines such as mobile phones will likely include a touch input device or other such input mechanisms, while a headless server machine will likely not include such a touch input device. It will be appreciated that the I/O components 618 may include many other components that are not shown in FIG. 6. The I/O components 618 are grouped according to functionality merely for simplifying the following discussion and the grouping is in no way limiting. In various example embodiments, the I/O components 618 may include output components 626 and input components 628. The output components 626 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 628 may include alphanumeric input components (e.g., a keyboard, a touch screen configured to receive alphanumeric input, a photo-optical keyboard, or other alphanumeric input components), point based input components (e.g., a mouse, a touchpad, a trackball, a joystick, a motion sensor, or other pointing instrument), tactile input components (e.g., a physical button, a touch screen that provides location and/or force of touches or touch gestures, or other tactile input components), audio input components (e.g., a microphone), and the like.

In further example embodiments, the I/O components 618 may include biometric components 630, motion components 634, environmental components 636, or position components 638 among a wide array of other components. For example, the biometric components 630 may include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram based identification), and the like. The motion components 634 may include acceleration sensor components (e.g., accelerometer), gravitation sensor components, rotation sensor components (e.g., gyroscope), and so forth. The environmental components 636 may include, for example, illumination sensor components (e.g., photometer), temperature sensor components (e.g., one or more thermometer that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detect concentrations of hazardous gases for safety or to measure pollutants in the atmosphere), or other components that may provide indications, measurements, or signals corresponding to a surrounding physical environment. The position components 638 may include location sensor components (e.g., a GPS receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 618 may include communication components 640 operable to couple the machine 600 to a network 632 or devices 620 via coupling 624 and coupling 622, respectively. For example, the communication components 640 may include a network interface component or other suitable device to interface with the network 632. In further examples, communication components 640 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 620 may be another machine or any of a wide variety of peripheral devices (e.g., a peripheral device coupled via a USB).

Moreover, the communication components 640 may detect identifiers or include components operable to detect identifiers. For example, the communication components 640 may include radio frequency identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 640 such as location via Internet Protocol (IP) geo-location, location via Wi-Fi® signal triangulation, location via detecting a NFC beacon signal that may indicate a particular location, and so forth.

GLOSSARY

"CARRIER SIGNAL" in this context refers to any intangible medium that is capable of storing, encoding, or carrying instructions 610 for execution by the machine 600, and includes digital or analog communications signals or other intangible medium to facilitate communication of such instructions 610. Instructions 610 may be transmitted or received over the network 632 using a transmission medium via a network interface device and using any one of a number of well-known transfer protocols.

"CLIENT DEVICE" in this context refers to any machine 600 that interfaces to a communications network 632 to obtain resources from one or more server systems or other client devices. A client device may be, but is not limited to, mobile phones, desktop computers, laptops, PDAs, smart phones, tablets, ultra books, netbooks, laptops, multi-processor systems, microprocessor-based or programmable consumer electronics, game consoles, STBs, or any other communication device that a user may use to access a network 632.

"COMMUNICATIONS NETWORK" in this context refers to one or more portions of a network 632 that may be an ad hoc network, an intranet, an extranet, a virtual private network (VPN), a LAN, a wireless LAN (WLAN), a WAN, a wireless WAN (WWAN), a metropolitan area network (MAN), the Internet, a portion of the Internet, a portion of the Public Switched Telephone Network (PSTN), a plain old telephone service (POTS) network, a cellular telephone network, a wireless network, a Wi-Fi® network, another type of network, or a combination of two or more such networks. For example, a network 632 or a portion of a network 632 may include a wireless or cellular network and the coupling may be a Code Division Multiple Access (CDMA) connection, a Global System for Mobile communications (GSM) connection, or other type of cellular or wireless coupling. In this example, the coupling may implement any of a variety of types of data transfer technology, such as Single Carrier Radio Transmission Technology (1xRTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard setting organizations, other long range protocols, or other data transfer technology.

"MACHINE-READABLE MEDIUM" in this context refers to a component, device or other tangible media able to store instructions 610 and data temporarily or permanently and may include, but is not be limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store instructions 610. The term "machine-readable medium" shall also be taken to include any medium, or combination of multiple media, that is capable of storing instructions 610 (e.g., code) for execution by a machine 600, such that the instructions 610, when executed by one or more processors 604 of the machine 600, cause the machine 600 to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" excludes signals per se.

"COMPONENT" in this context refers to a device, physical entity, or logic having boundaries defined by function or subroutine calls, branch points, APIs, or other technologies that provide for the partitioning or modularization of particular processing or control functions. Components may be combined via their interfaces with other components to carry out a machine process. A component may be a packaged functional hardware unit designed for use with other components and a part of a program that usually performs a particular function of related functions. Components may constitute either software components (e.g., code embodied on a machine-readable medium) or hardware components. A "hardware component" is a tangible unit capable of performing certain operations and may be configured or arranged in a certain physical manner. In various example embodiments, one or more computer systems (e.g., a standalone computer system, a client computer system, or a server computer system) or one or more hardware components of a computer system (e.g., a processor or a group of processors 604) may be configured by software (e.g., an application 516 or application portion) as a hardware component that operates to perform certain operations as described herein. A hardware component may also be implemented mechanically, electronically, or any suitable combination thereof. For example, a hardware component may include dedicated circuitry or logic that is permanently configured to perform certain operations. A hardware component may be a special-purpose processor, such as a field-programmable gate array (FPGA) or an application specific integrated circuit (ASIC). A hardware component may also include programmable logic or circuitry that is temporarily configured by software to perform certain operations. For example, a hardware component may include software executed by a general-purpose processor 604 or other programmable processor 604. Once configured by such software, hardware components become specific machines 600 (or specific components of a machine 600) uniquely tailored to perform the configured functions and are no longer general-purpose processors 604. It will be appreciated that the decision to implement a hardware component mechanically, in dedicated and permanently configured circuitry, or in temporarily configured circuitry (e.g., configured by software), may be driven by cost and time considerations. Accordingly, the phrase "hardware component" (or "hardware-implemented component") should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware components are temporarily configured (e.g., programmed), each of the hardware components need not be configured or instantiated at any one instance in time. For example, where a hardware component comprises a general-purpose processor 604 configured by software to become a special-purpose processor, the general-purpose processor 604 may be configured as respectively different special-purpose processors (e.g., comprising different hardware components) at different times. Software accordingly configures a particular processor or processors 604, for example, to constitute a particular hardware component at one instance of time and to constitute a different hardware component at a different instance of time. Hardware components can provide information to, and receive information from, other hardware components. Accordingly, the described hardware components may be regarded as being communicatively coupled. Where multiple hardware components exist contemporaneously, communications may be achieved through signal transmission (e.g., over appropriate circuits and buses 602) between or among two or more of the hardware components. In embodiments in which multiple hardware components are configured or instantiated at different times, communications between such hardware components may be achieved, for example, through the storage and retrieval of information in memory structures to which the multiple hardware components have access. For example, one hardware component may perform an operation and store the output of that operation in a memory device to which it is communicatively coupled. A further hardware component may then, at a later time, access the memory device to retrieve and process the stored output. Hardware components may also initiate communications with input or output devices, and can operate on a resource (e.g., a collection of information). The various operations of example methods described herein may be performed, at least partially, by one or more processors 604 that are temporarily configured (e.g., by software) or permanently configured to perform the relevant operations. Whether temporarily or permanently configured, such processors 604 may constitute processor-implemented components that operate to perform one or more operations or functions described herein. As used herein, "processor-implemented component" refers to a hardware component implemented using one or more processors 604. Similarly, the methods described herein may be at least partially processor-implemented, with a particular processor or processors 604 being an example of hardware. For example, at least some of the operations of a method may be performed by one or more processors 604 or processor-implemented components. Moreover, the one or more processors 604 may also operate to support performance of the relevant operations in a "cloud computing" environment or as a "software as a service" (SaaS). For example, at least some of the operations may be performed by a group of computers (as examples of machines 600 including processors 604), with these operations being accessible via a network 632 (e.g., the Internet) and via one or more appropriate interfaces (e.g., an API). The performance of certain of the operations may be distributed among the processors 604, not only residing within a single machine 600, but deployed across a number of machines 600. In some example embodiments, the processors 604 or processor-implemented components may be located in a single geographic location (e.g., within a home environment, an office environment, or a server farm). In other example embodiments, the processors 604 or processor-implemented components may be distributed across a number of geographic locations.

"PROCESSOR" in this context refers to any circuit or virtual circuit (a physical circuit emulated by logic executing on an actual processor 604) that manipulates data values according to control signals (e.g., "commands," "op codes," "machine code," etc.) and which produces corresponding output signals that are applied to operate a machine 600. A processor 604 may be, for example, a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC) or any combination thereof. A processor 604 may further be a multi-core processor having two or more independent processors 604 (sometimes referred to as "cores") that may execute instructions 610 contemporaneously.

What is claimed is:

1. A capacitive digital to analog convertor (CDAC) comprising:
    a first set of capacitors comprising a first input capacitor, a first high-reference capacitor, and a first low-reference capacitor; and
    a set of switches for configuring the CDAC into a loading configuration to provide voltage to the first set of capacitors, or a conversion configuration to cause the CDAC to provide an output voltage based on voltage stored in the first input capacitor and one of either the first high-reference capacitor or the first low-reference capacitor.

2. The CDAC of claim 1, wherein the set of switches comprises a first switch coupled between an input voltage source and the first input capacitor, a second switch coupled between a high-reference voltage source and the first high-reference capacitor, and a third switch coupled between a low-reference voltage source and the first low-reference capacitor.

3. The CDAC of claim 2, wherein configuring the CDAC into the loading configuration causes the first switch, the second switch, and the third switch be in a closed state, and configuring the CDAC into the conversion configuration causes the first switch, the second switch, and the third switch be in an open state.

4. The CDAC of claim 3, wherein the set of switches further comprises a fourth switch coupled between the first high-reference capacitor and the first input capacitor, and a fifth switch coupled between the first low-reference capacitor and the first input capacitor.

5. The CDAC of claim 4, wherein configuring the CDAC into the loading configuration causes the fourth switch and the fifth switch to be in the open state, and configuring the CDAC into the conversion configuration causes either the fourth switch to be in the open state and the fifth switch to be in the closed state, or the fourth switch to be in the closed state and the fifth switch to be in the open state.

6. The CDAC of claim 1, wherein the first input capacitor is a first size and the first high-reference capacitor is a second size that smaller than the first size.

7. The CDAC of claim 1, further comprising:
    a second set of capacitors comprising a second input capacitor, a second high-reference capacitor, and a second low-reference capacitor, wherein configuring the CDAC into the loading configuration further provide voltage to the second set of capacitors, and configuring the CDAC into the conversion configuration causes the CDAC to provide the output voltage further based on voltage stored in the second input capacitor and one of either the second high-reference capacitor or the second low-reference capacitor.

8. The CDAC of claim 7, wherein the first input capacitor and the second input capacitor are arranged in a binary weighted capacitor array.

9. The CDAC of claim 1, wherein the CDAC is implemented within a successive approximation register analog to digital convertor.

10. The CDAC of claim 9, wherein the CDAC is configured into the conversion configuration based on an input received from the successive approximation register analog to digital convertor, the input indicating whether to provide the output voltage based on voltage stored in the first high-reference capacitor or the first low-reference capacitor.

11. A method for converting digital data using a capacitive digital to analog convertor (CDAC), the method comprising:
    configuring the CDAC into a loading configuration to provide voltage to a first set of capacitors comprising a first input capacitor, a first high-reference capacitor, and a first low-reference capacitor; and
    configuring the CDAC into a conversion configuration to cause the CDAC to provide an output voltage based on voltage stored in the first input capacitor and one of either the first high-reference capacitor or the first low-reference capacitor.

12. The method of claim 11, wherein a first switch is coupled between an input voltage source and the first input capacitor, a second switch is coupled between a high-reference voltage source and the first high-reference capacitor, and a third switch is coupled between a low-reference voltage source and the first low-reference capacitor.

13. The method of claim 12, wherein configuring the CDAC into the loading configuration comprises configuring the first switch, the second switch, and the third switch into a closed state, and configuring the CDAC into the conversion configuration comprises configuring the first switch, the second switch, and the third switch into an open state.

14. The method of claim 13, wherein configuring the CDAC into the loading configuration further comprises configuring a fourth switch coupled between the first high-reference capacitor and the first input capacitor and a fifth switch coupled between the first low-reference capacitor and the first input capacitor into the open state.

15. The method of claim 14, wherein configuring the CDAC into the conversion configuration comprises configuring either the fourth switch into the open state and the fifth switch into the closed state, or the fourth switch into the closed state and the fifth switch into the open state.

16. The method of claim 11, wherein the first input capacitor is a first size and the first high-reference capacitor is a second size that smaller than the first size.

17. The method of claim 11, wherein configuring the CDAC into the conversion configuration further provides voltage to a second set of capacitors comprising a second input capacitor, a second high-reference capacitor, and a second low-reference capacitor, and converting the CDAC into the conversion configuration causes the CDAC to provide an output voltage further based on voltage stored in the second input capacitor and one of either the second high-reference capacitor or the second low-reference capacitor.

18. The method of claim 17, wherein the first input capacitor and the second input capacitor are arranged in a binary weighted capacitor array.

19. The method of claim 11, wherein CDAC is implemented within a successive approximation register analog to digital convertor.

20. The method of claim 19, wherein the CDAC is configured into the conversion configuration based on an input received from the successive approximation register analog to digital convertor, the input indicating whether to provide an output voltage based on voltage stored in the first high-reference capacitor or the first low-reference capacitor.

* * * * *